США005623399A

United States Patent [19]
Ishii et al.

[11] Patent Number: 5,623,399
[45] Date of Patent: Apr. 22, 1997

[54] INVERTER APPARATUS HAVING CAPACITORS MOUNTED PROXIMAL TO ASSOCIATED SWITCHING CIRCUITS

[75] Inventors: Jun Ishii, Okazaki; Koshi Torii, Iwakura; Tatsuya Machi, Kariya, all of Japan

[73] Assignee: Nippondenso Co., Ltd., Kariya, Japan

[21] Appl. No.: 400,110

[22] Filed: Mar. 6, 1995

[30] Foreign Application Priority Data

Mar. 4, 1994 [JP] Japan .................................. 6-034457
Apr. 8, 1994 [JP] Japan .................................. 6-070756

[51] Int. Cl.$^6$ ...................................................... H01H 1/00
[52] U.S. Cl. ........................... 363/132; 363/141; 363/144
[58] Field of Search ................................ 363/17, 58, 98, 363/131, 132, 135, 136, 141, 144; 361/687, 688, 707

[56] References Cited

U.S. PATENT DOCUMENTS

| 4,975,824 | 12/1990 | Huss et al. ............................. | 363/132 |
| 4,975,825 | 12/1990 | Huss et al. ............................. | 363/141 |
| 4,979,090 | 12/1990 | Huss et al. ............................. | 363/141 |

FOREIGN PATENT DOCUMENTS 59-15255  5/1984  Japan .
2294278  12/1990 Japan .
3277182  12/1991 Japan .
3124785  12/1991 Japan .

*Primary Examiner*—Peter S. Wong
*Assistant Examiner*—Adolf Berhane
*Attorney, Agent, or Firm*—Cushman Darby & Cushman IP Group of Pillsbury Madison & Sutro LLP

[57] ABSTRACT

An inverter device for changing direct current to alternating current for supplying to an electric motor which may be employed in an electric automobile. This inverter device includes a plurality of switching units, a cooling support member, capacitors, and pairs of first and second conductive plates. Each of the switching units has a box-like casing mounted on the cooling support member, and includes a positive switching element, a negative switching element connected in series, and positive and negative terminals. The positive and negative terminals are exposed on the upper wall of the casing. Each of the capacitors is arranged over an upper wall of the casing of a corresponding one of the switching units, and has positive and negative charge/discharge terminals. The first conductive plate of each pair connects the positive terminal of one of the switching units with the positive charge/discharge terminal of a corresponding one of the capacitors, while the second conductive plate of each pair connects the negative terminal of one of the switching units with the negative charge/discharge terminal of a corresponding one of the capacitors.

13 Claims, 16 Drawing Sheets

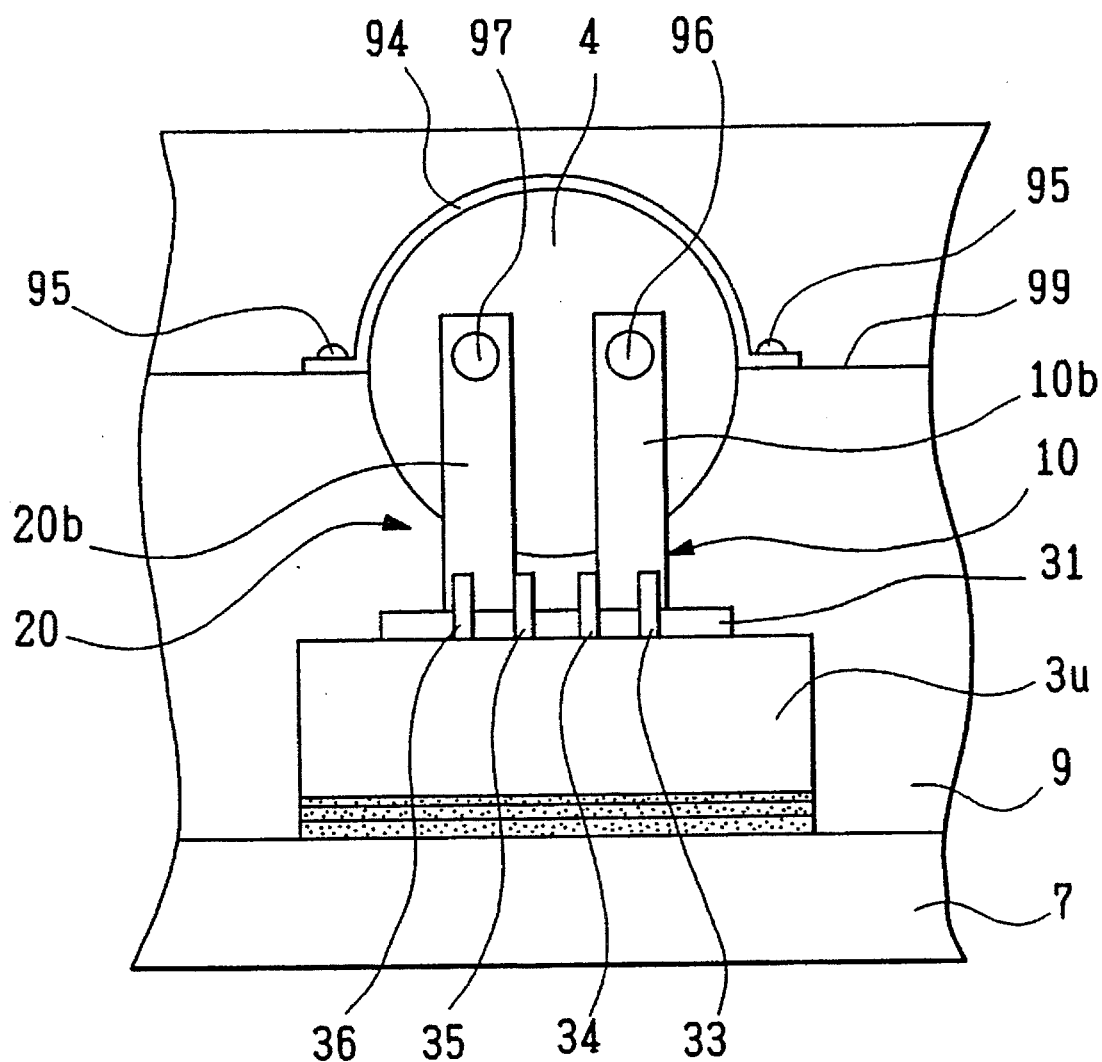

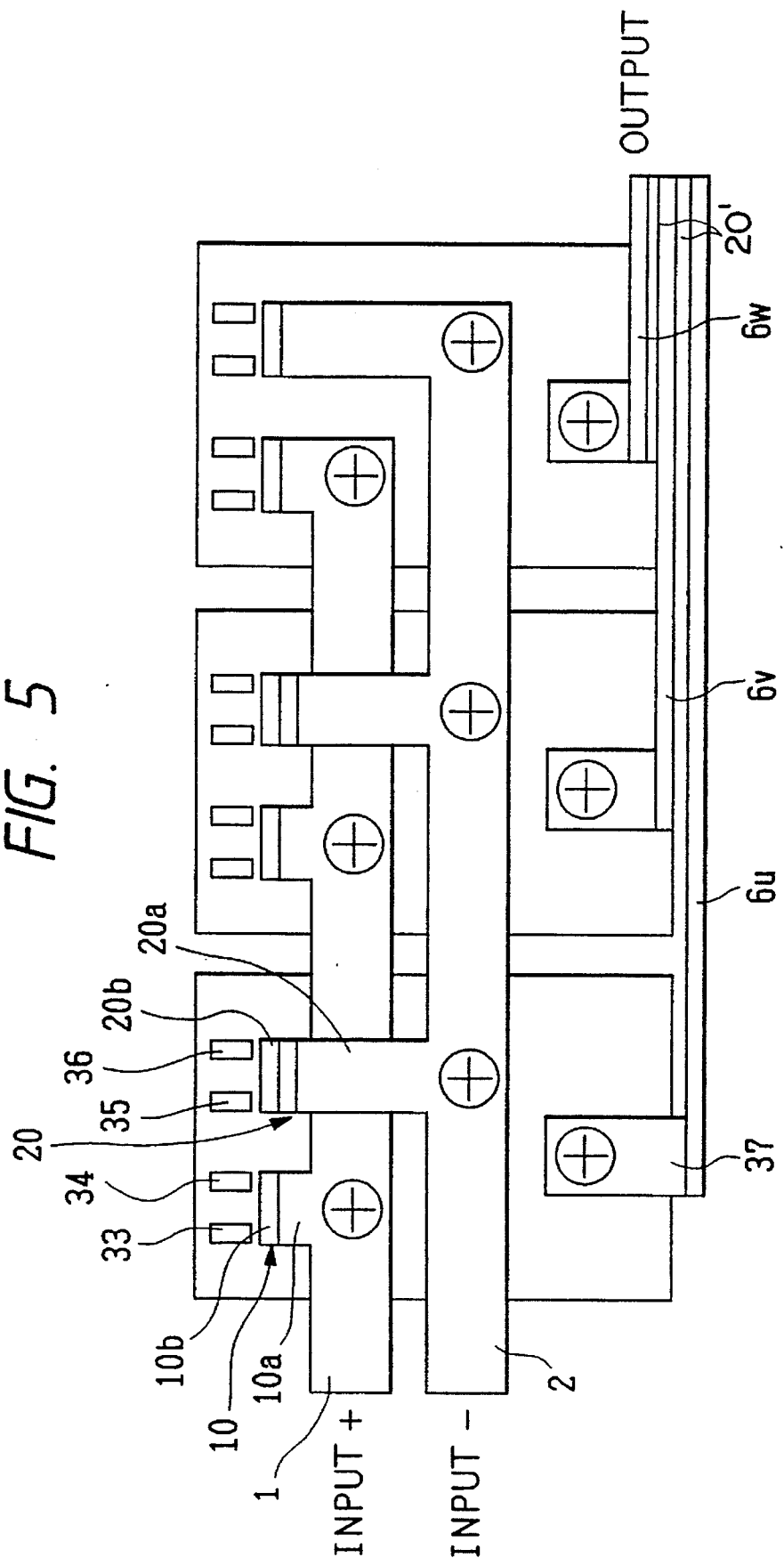

INVERTER APPARATUS HAVING CAPACITORS MOUNTED PROXIMAL TO ASSOCIATED SWITCHING CIRCUITS

BACKGROUND OF THE INVENTION

1. Technical Field of the Invention

The present invention relates generally to an inverter apparatus, and more particularly to an improved structure of an inverter apparatus designed to change direct current to alternating current for supplying power to an electric motor which may be employed in an electric automobile.

2. Background Art

Japanese Utility Model First Publication No. 58-153592 teaches an inverter device which includes single-phase inverter circuits each composed of a high-side switch and a low-side switch connected in series with each other. A given number of the single-phase inverter circuits are connected to a pair of terminals of a DC power source through positive and negative bus lines, respectively. The inverter device further includes capacitors each connected to both power terminals of each of the switching units for restricting voltage from being induced by the inductance of circuit lines.

Japanese Utility Model First Publication No. 59-135095 discloses an inverter device composed of switching units and capacitors. Each of the capacitors is arranged so as to correspond to one of the switching units to complete a unit hasing similar circuit structure to that of the above Publication. Additionally, each of the capacitors is oriented vertically adjacent a cooling block.

Japanese Patent First Publication No. 2-294278 discloses a DC power source composed of a rectifier and a plurality of smoothing capacitors for power supply to an inverter device. The smoothing capacitors are connected in parallel with each other through circuit lines having the same inductance.

FIGS. 19 and 20 exemplify a conventional inverter device having a structure similar to the to above mentioned prior art devices. FIG. 19 is a front view which illustrates a capacitor arranged vertically in the vicinity of a cooling block. FIG. 20 is a plan view thereof.

The inverter device in FIGS. 19 and 20 includes a cooling block 1a, three switching units 3, a capacitor 4, a positive bus line 5, a negative bus line 6, a connecting conductor 50 extending from the positive bus line 5, and a connecting conductor 60 extending from the negative bus line 6.

With the arrangements shown, the prior art inverter device cannot provide for a sufficient reduction in voltage (surge voltage) induced by the inductance of the connecting conductors 50 and 60 in a high-speed switching operation. A great reduction in the induced voltage is necessary to protect the elements of the inverter device. Of course, it is possible to provide a snubber circuit to decrease the induced voltage, but this complicates the circuit structure. This is so because the capacitor 4 and the switching units 3, as can be seen in FIG. 19, have different terminal heights, thus requiring the long L-shaped connecting conductors 50 and 60.

SUMMARY OF THE INVENTION

It is therefore a principal object of the present invention to avoid the disadvantages of the prior art.

It is another object of the present invention to provide an improved structure of an inverter apparatus which is designed to reduce induced voltage which is produced by the inductance of circuit lines.

It is a further object of the present invention to provide an improved structure of an inverter apparatus which is designed to prevent switching units from being damaged, by the induced voltage mentioned above.

According to one aspect of the present invention, there is provided an inverter apparatus which comprises (1) a plurality of switching units each having a box-like casing defined by a bottom wall, side walls, and an upper wall, each of the switching units including a first switching element, a second switching element connected in series with the first switching element, and positive and negative terminals, the positive and negative terminals being exposed on the upper wall of the casing, the first switching element being connected to a DC power source through a positive bus line extending from the positive terminal, the second switching element being connected to the DC power source through a negative bus line extending from the negative terminal, the first and second switching elements outputting alternating current through an AC current output line, (2) a cooling support member having a mount surface, on which the bottom wall of each of the switching units is disposed, for cooling the switching units, (3) capacitors each arranged over the upper wall of the casing of one of the switching units, each of the capacitors having a positive charge/discharge terminal and a negative charge/discharge terminal, and (4) pairs of first and second conductive plates, the first conductive plate of each pair connecting the positive terminal on the upper wall of one of the switching units with the positive charge/discharge terminal of a corresponding one of the capacitors, the second conductive plate of each pair connecting the negative terminal on the upper wall of one of the switching units with the negative charge/discharge terminal of a corresponding one of the capacitors.

In the preferred mode of the invention, each of the first and second conductive plates in each pair of conductive plates is formed with an L-shaped plate. The L-shaped plate has a horizontal portion and a vertical portion. The horizontal portion is secured on the upper wall of the casing of the corresponding one of the switching units and extending horizontally thereover. The vertical portion extends vertically from an end of the horizontal portion to support the corresponding one of the capacitors.

The horizontal portion of either of the first and second conductive plates is formed geometrically as to extend over either of the positive and negative bus lines through an electrically insulating member.

A support member is further provided which is installed on the mount surface of the cooling support member, and extends substantially in parallel to the side walls of the casings of the switching units. Each of the capacitors has the positive and negative charge/discharge terminals on a first end portion thereof. The support member supports a second end portion of each of the capacitors opposite the first end portion.

A control circuit is provided for controlling switching operations of the first and second switching elements of the switching units. The control circuit is supported by the support member.

The switching units are mounted on the cooling support member in first and second rows extending parallel to each other. The switching units in the first row are so arranged in a mirror image relation to the switching units in the second row as to orient the positive and negative charge/discharge terminals thereof opposite the positive and negative charge/discharge terminals of a corresponding one of the switching units.

The positive and negative bus lines have portions, extending between the first and second rows, connecting with the positive and negative charge/discharge terminals of the capacitors.

First and second holders may be mounted on the mount surface of the cooling support member. The first holder retains the capacitors connected to the switching units in the first row, while the second holder retains the capacitors connected to the switching units in the second row. The control circuit may be supported by the first and second holders over the cooling support member.

The support member has formed therein an opening through which the AC current output line extends. A current sensor is mounted in the opening of the support member for detecting current flowing through the AC current output line.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for the purpose of explanation and understanding only.

In the drawings:

FIG. 4 is a side elevation, as viewed from an arrow A in FIG. 3;

FIG. 5 is a plan view which illustrates switching units according to a first embodiment;

DESCRIPTION OF THE PREFERRED EMBODIMENT

Figure 1:
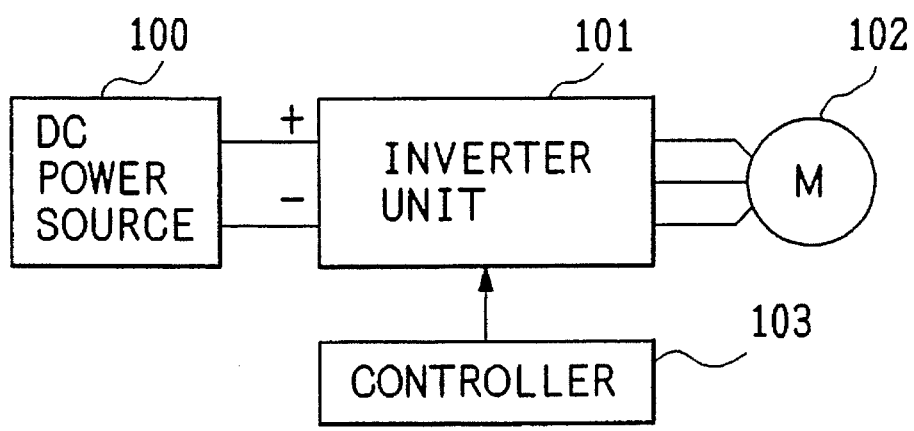
FIG. 1 is a block diagram which shows a motor driving system for an electric automobile employing an inverter unit of the present invention.

Referring now to the drawings, wherein like numbers refer to like parts in several views, particularly to FIG. 1, there is shown a motor driving system for an electric automobile.

The motor driving system generally includes a DC power source 100 (e.g., a battery mounted in the automobile), an inverter unit 101, a three-phase induction motor 102, and a control unit 103. The inverter unit 100 is responsive to a switching signal provided by the control unit 103 to change direct current supplied from the DC power source 100 into three-phase alternating current for supplying power to the three-phase induction motor 102.

Figure 2:
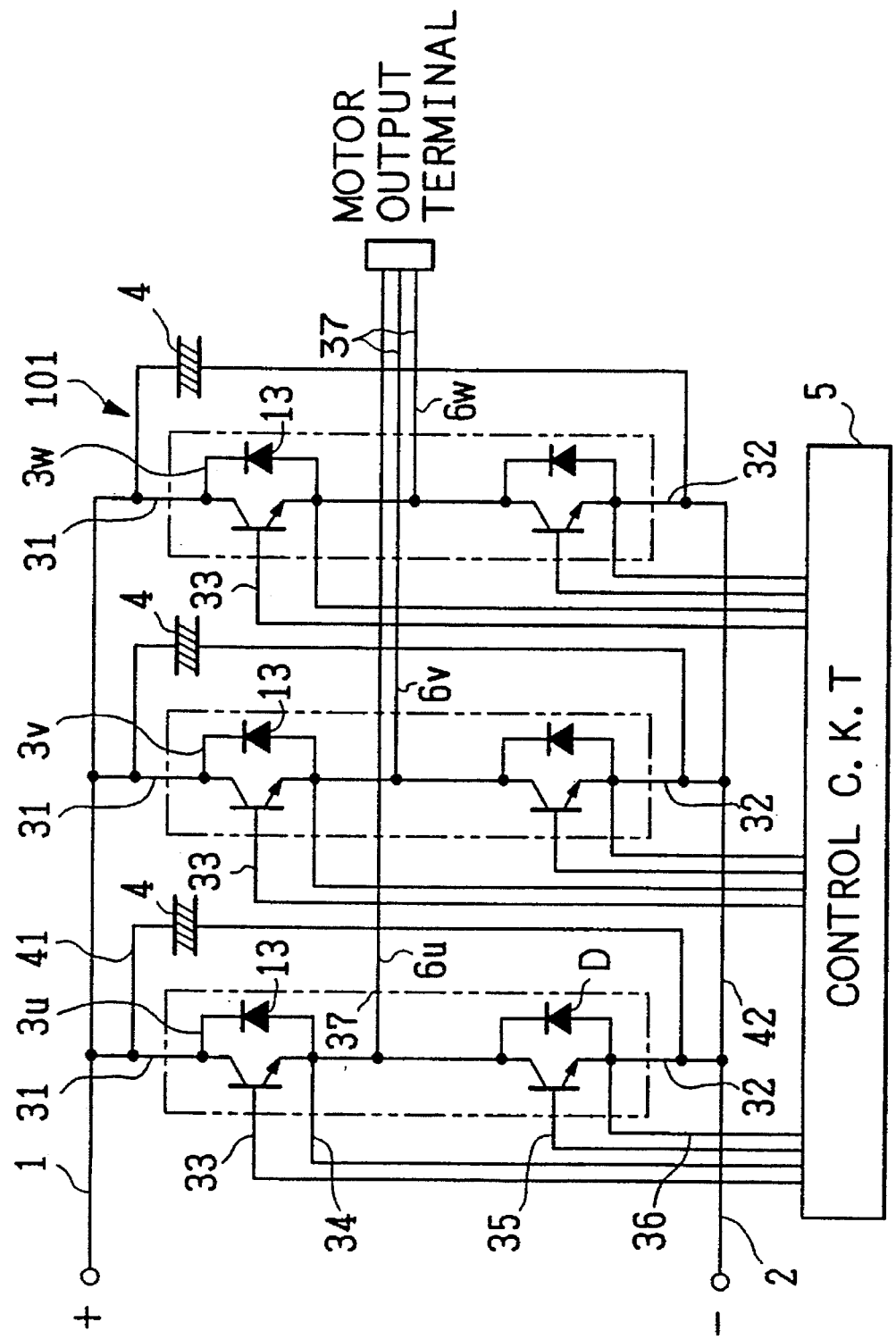
FIG. 2 is a circuit diagram which shows an inverter unit of the invention.

FIG. 2 shows a circuit arrangement of the inverter unit 101.

A U-phase switching unit 3u, a V-phase switching unit 3u, and a W-phase switching unit 3w are connected to positive and negative lines 1 and 2 through their bus lines, or positive (+) and negative (−) power terminals 31 and 32, respectively. The positive and negative lines 1 and 2 are connected to positive and negative terminals of the DC power source 100, respectively. The power terminals 31 and 32 of each of the switching units 3u, 3v, and 3w are exposed on an upper wall of the casing of each of the switching units 3u, 3v, and 3w, and connected to positive and negative charge/discharge terminals 41 and 42 of a corresponding one of capacitors 4.

Each of the switching units 3u, 3v, and 3w includes a single-phase inverter circuit which is provided with a high-side switch and a low-side switch arranged in series. The high-side switch and the low-side switch are each composed of a bipolar transistor (a FET or an IGBT may alternatively be used) and a protective diode 13. The protective diode 13 is arranged between an emitter and a collector of the bipolar transistor.

The base and the emitter of the bipolar transistors are connected to a control circuit 5 through control terminals 33 to 36 of the switching units 3u, 3v, and 3w, respectively. The control circuit 5 provides the base current to the base of one of the bipolar transistors while cutting the supply of the base current to the bases of the other bipolar transistors. This causes the high-side switches and the low-side switches of the switching units 3u, 3v, and 3w to be energized selectively, thereby applying three-phase alternating currents to the induction motor 102 through output bus lines 6u, 6v, and 6w from output terminals 37. Each of the output terminals 37 communicates with a line connecting the high-side switch with the low-side switch of a corresponding one of the switching units.

Figure 3:
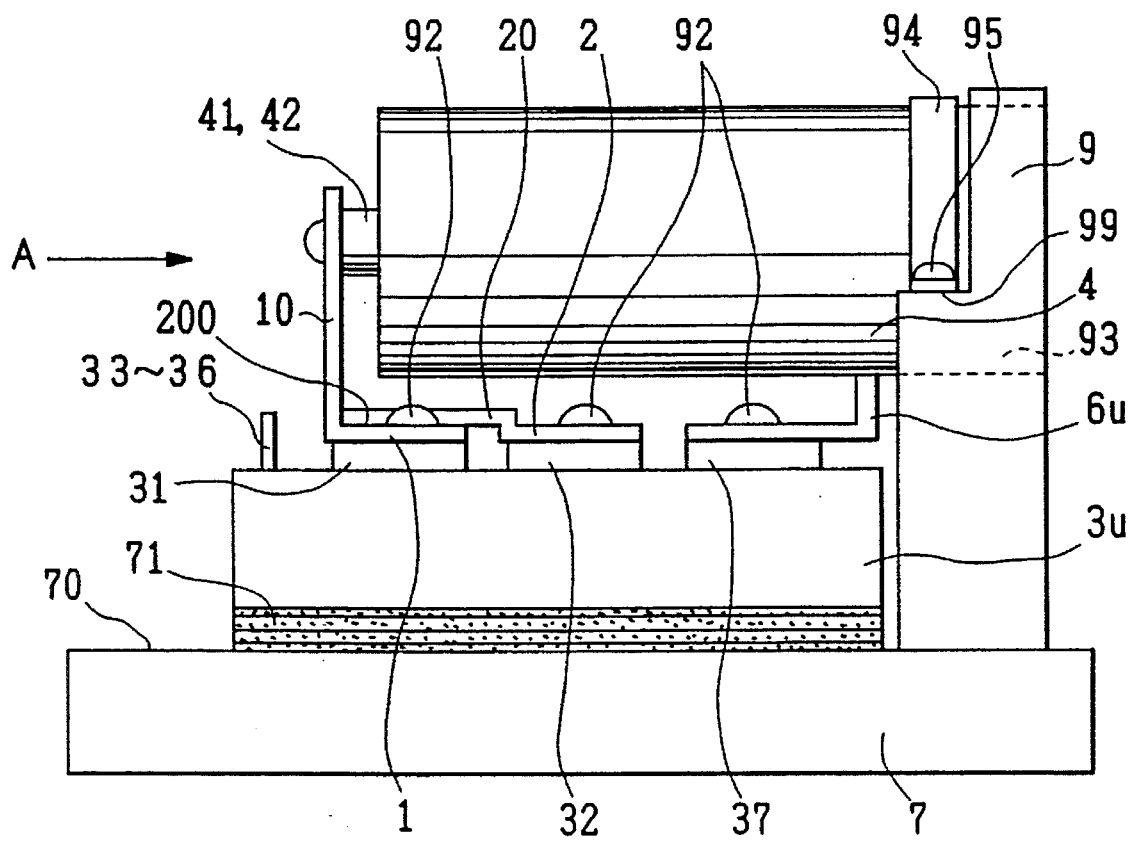
FIG. 3 is a front view which illustrate an inverter unit of the invention.

FIGS. 3 and 4 are front and side views illustrating the inverter unit 101.

The switching units 3u, 3v, and 3w, as can be seen in the drawings, have box-like casings, respectively, and are arranged in alignment with each other on a mount surface 70 of an aluminum cooling block 7 through thermal conductive grease 71. The cooling block 7 is designed to cool the switching units 3u, 3v, and 3w through the mount surface 70. FIGS. 3 and 4 shows only the U-phase switching unit 3u for the sake of brevity of illustration.

On an upper surface of an individual switching unit, for example, the U-phase switching unit 3u shown, the positive power terminal 31, the negative power terminal 32, the control terminals 33 to 36 (only 33 is shown), and the output terminal 37 are mounted. The positive bus line 1 is arranged on the positive power terminal 31. The negative bus line 2 is arranged on the negative power terminal 32. The output bus line 6u (6v, 6w) is arranged on output terminals 37.

A holder 9 made of an aluminum block is mounted on the mount surface 70 of the cooling block 7. The holder 9 extends vertically in parallel with side walls of the casing of each of the switching units 3u, 3v, and 3w, and bears the bottom of each of the capacitors 4 over the switching units 3u, 3v, and 3w. Specifically, the holder 9 has a shoulder portion 99, and in an upper portion thereof, are defined capacitor storage openings 93 oriented horizontally, as viewed in the drawings, partly passing through the shoulder portion 99. Ends (i.e., the bottoms) of the capacitors 4 are inserted into the capacitor storage openings 93 and then fixed on the shoulder portion 99 using clamp members 94 and screws 95, respectively. The capacitors 4 may alternatively be mounted so as to have the bottoms projecting outside the holder 9.

Three pairs of connecting conductors 10 and 20 are secured on the positive bus line 1 and the negative bus line 2. The connecting conductors 10 and 20 are each made of an L-shaped strip member. Each of the connecting conductors 10 includes, as shown in FIG. 5, a horizontal portion 10a and a vertical portion 10b extending from an end of the horizontal portion 10a. The horizontal portion 10a extends horizontally, as viewed in FIG. 3, from the positive bus line 1. The vertical portion 10b extends upward at the right angle to the horizontal portion 10a. Similarly, each of the connecting conductors 20 includes a horizontal portion 20a and a vertical portion 20b. The horizontal portion 20a, as can be seen in FIG. 3, has an extension oriented downward at a junction with the negative bus line 2, and extends horizontally over the positive bus line 1 in parallel to the horizontal portion 10a. The vertical portion 20b extends upward at the right angle to the horizontal portion 20a. The horizontal portion 20a, as can be seen in FIG. 5, is longer than the horizontal portion 10a.

Each of the connecting conductors 10 is, as shown in FIGS. 3 and 4, connected at its upper end to the positive charge/discharge terminal 41 of a corresponding one of the capacitors 4 through a screw 96. Similarly, each of the connecting conductors 20 is connected at its upper end to the negative charge/discharge terminal 42 of a corresponding one of the capacitors 4 through a screw 97. With these arrangements, each of the capacitors 4 is supported horizontally over the corresponding switching unit at a given short interval.

Between the positive bus line 1 and the horizontal portion 20a of each of the connecting conductors 20, an electrically insulating film 200 is provided. Similarly, between each of the output bus lines 6u, 6v, and 6w and an adjacent one, electrical insulating films 201 are disposed.

With the above discussed inverter circuit arrangements, the lengths of the connecting conductors 10 and 20 may be shorter than those of a conventional device, thus resulting in decreased inductances sufficient for reducing induced voltages in switching operations of the switching units.

It is preferable that a snubber circuit be arranged between the emitter and the collector of the bipolar transistor of each of the switching units 3u, 3v, and 3w. The reduction in induced voltage permits the structure of the snubber circuit to be compact.

Further, a snubber circuit may be provided in the control unit 5 controlling switching operations of the switching units 3u, 3v, and 3w. Alternatively, the control circuit 5 may be provided exclusively for a snubber circuit. In either case, such a snubber circuit is provided as a surge voltage control circuit arranged between the collector and the emitter of each of the bipolar transistors.

Figure 6:
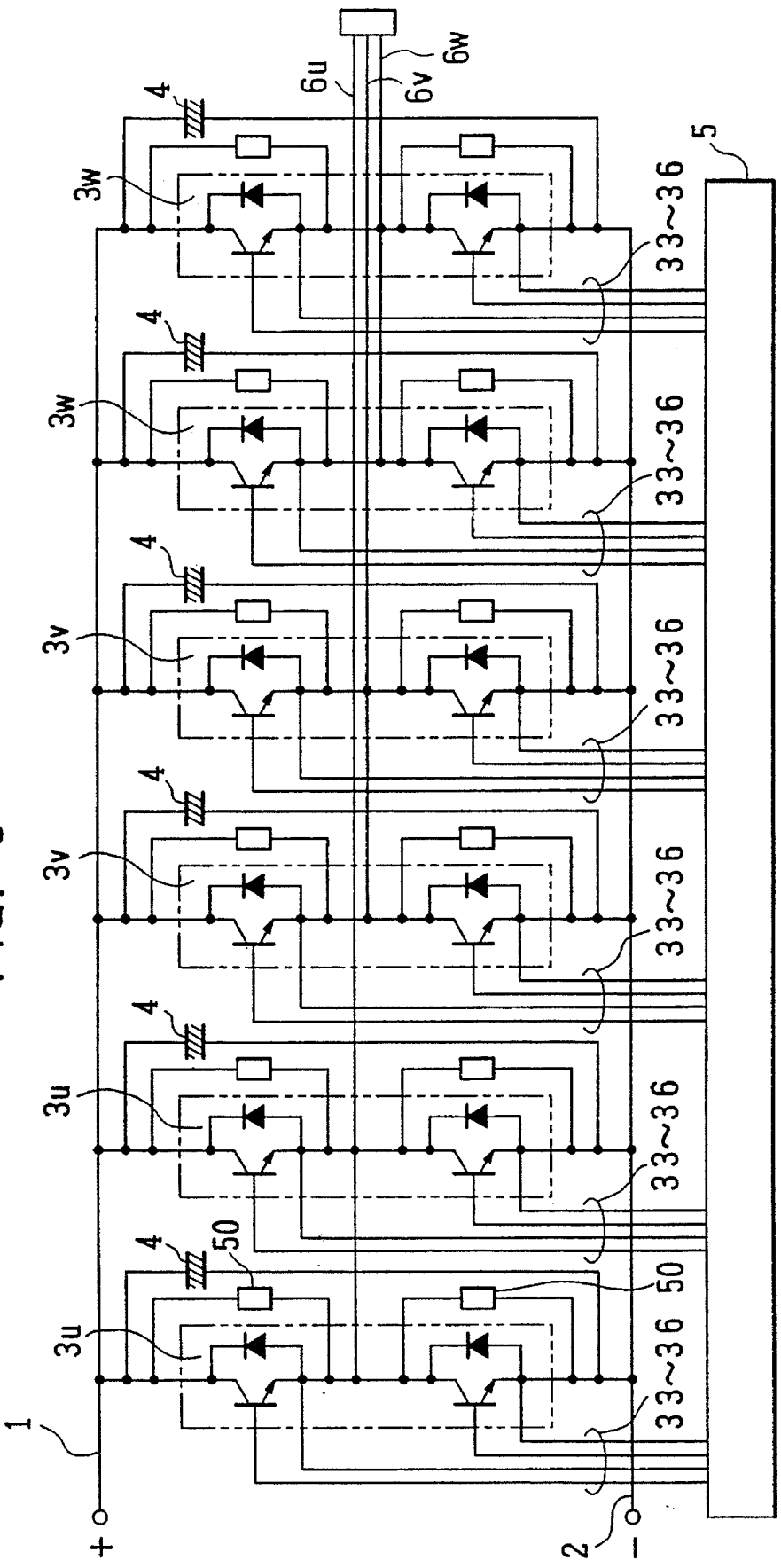
FIG. 6 is a circuit diagram which shows an inverter unit of a second embodiment.

Referring to FIG. 6, there is shown a second embodiment of the inverter unit 101, which has substantially the same electrical arrangements as those of the first embodiment in FIG. 2, and explanation thereof in detail will be omitted here.

Figure 7:
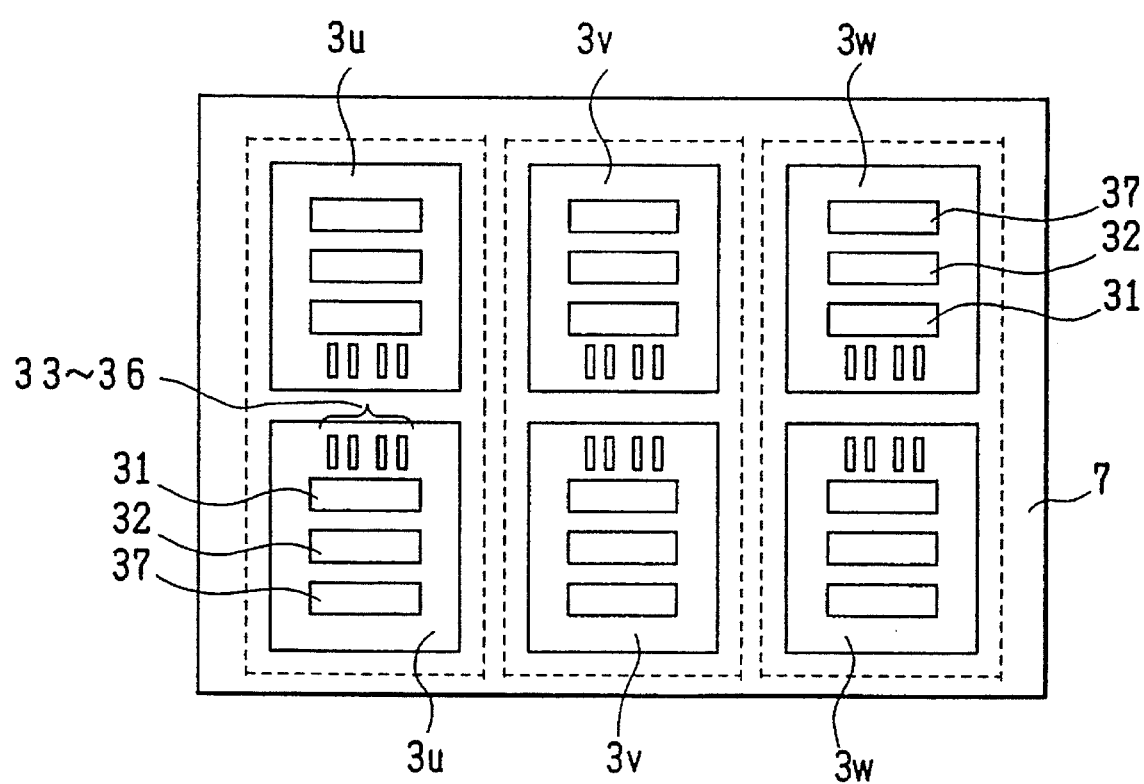
FIG. 7 is a schematic plan view which shows arrangements of switching units of a second embodiment.
Figure 8:
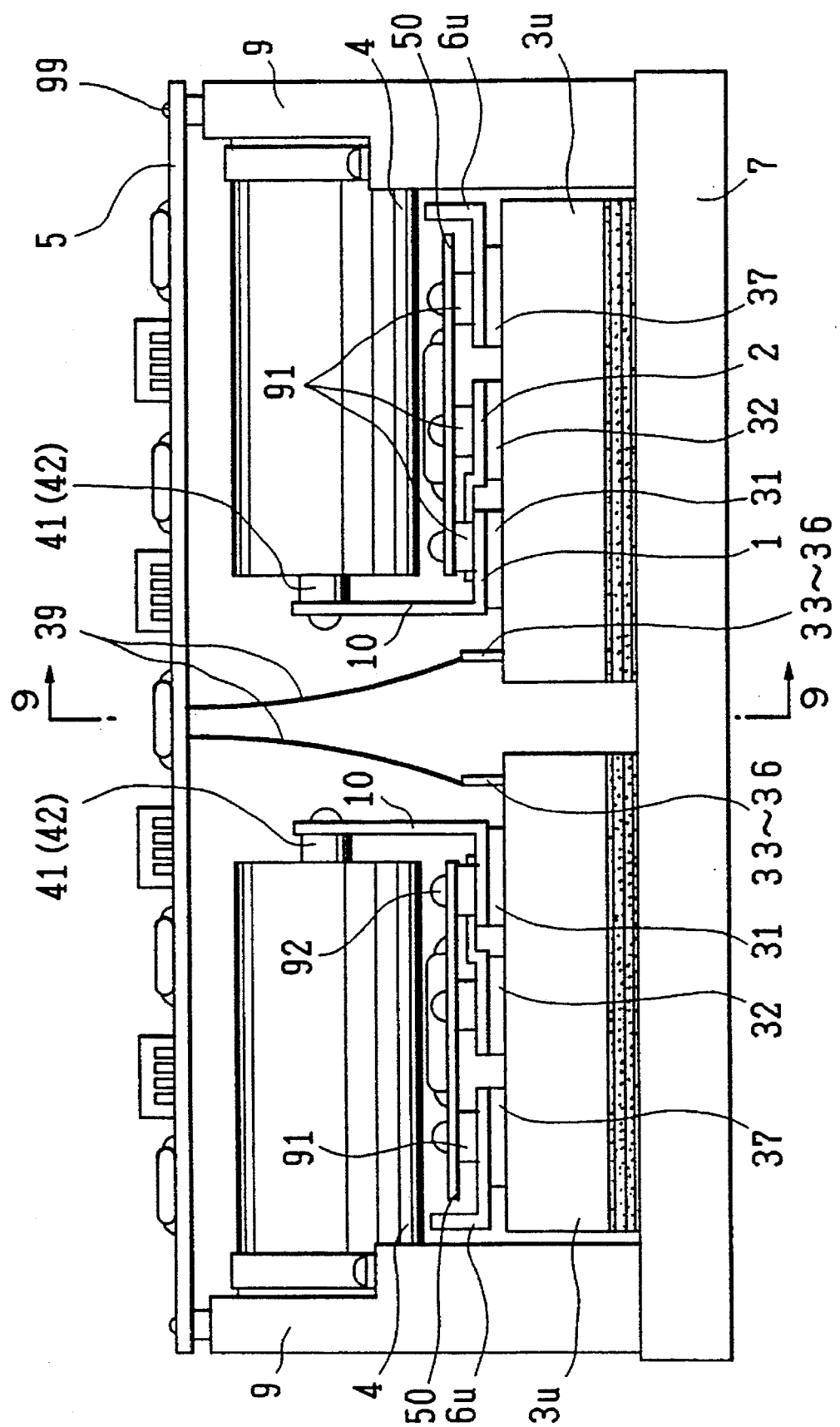
FIG. 8 is a front view which shows an inverter unit of a second embodiment.

Three pairs of switching units 3u, 3v, and 3w are electrically connected in the manner, as illustrated in FIG. 6, and arranged physically in two rows, as illustrated in FIGS. 7 and 8.

Figure 9:
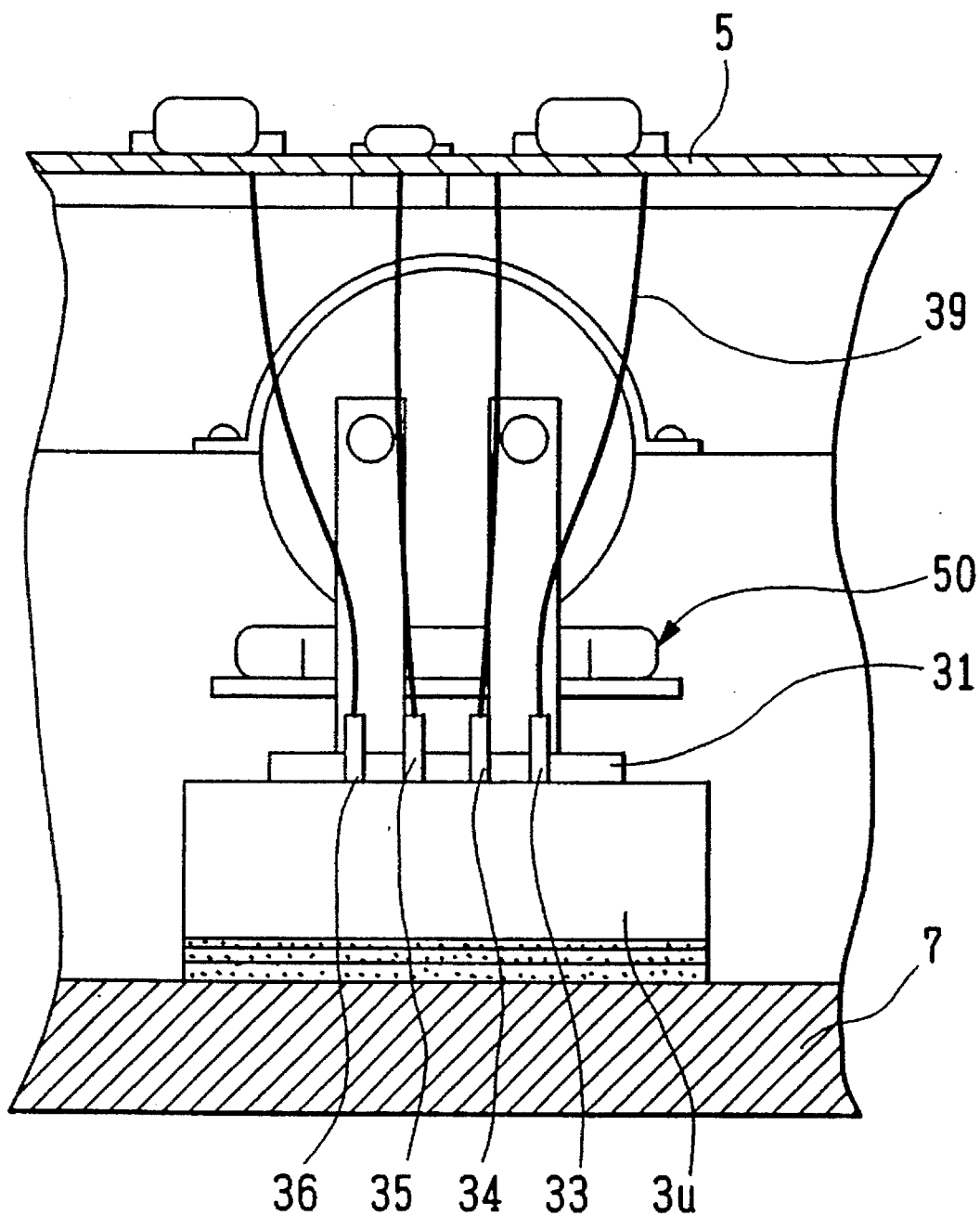
FIG. 9 is a partial side view taken along the line 9—9 in FIG. 8.

The two switching units in each pair of switching units 3u, 3v, and 3w are oriented in a mirror image relation. Two holders 9 are, as shown in FIG. 8, installed on the cooling block 7 to mount thereon the control circuit 5 over the switching units 3, 3v, and 3w using screws 99. A snubber circuit 50 is arranged between each of the switching units 3u, 3v, and 3w and the capacitor 40. Signal lines 39 are, as clearly shown in FIG. 9, arranged to connect the control circuit 5 with the control terminals 33 to 36, respectively.

Each of the bus lines 1, 2, 6u, 6v, and 6w is made of a copper strip. On these bus lines, the snubber circuits 50 are supported through conductive studs 91. Long screws 92 are inserted into tapped holes formed in the switching units 3u, 3v, and 3w through the studs 91, and the bus lines 1, 2, 6u, 6v, and 6w, respectively, to mount the bus lines and the snubber circuits on the switching units.

Figure 10:
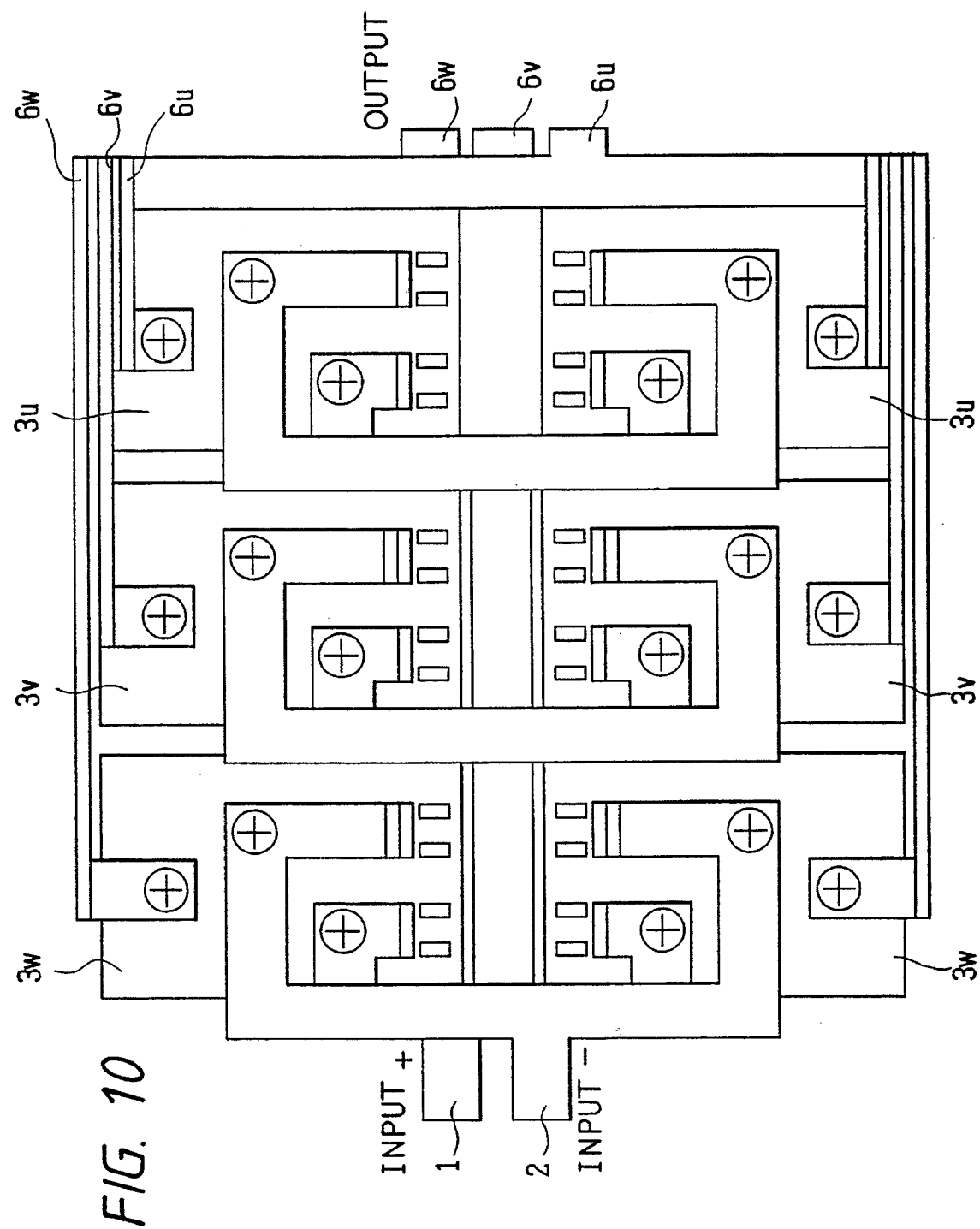
FIG. 10 is a plan view which illustrates arrangements of switching units of a second embodiment.
Figure 11:
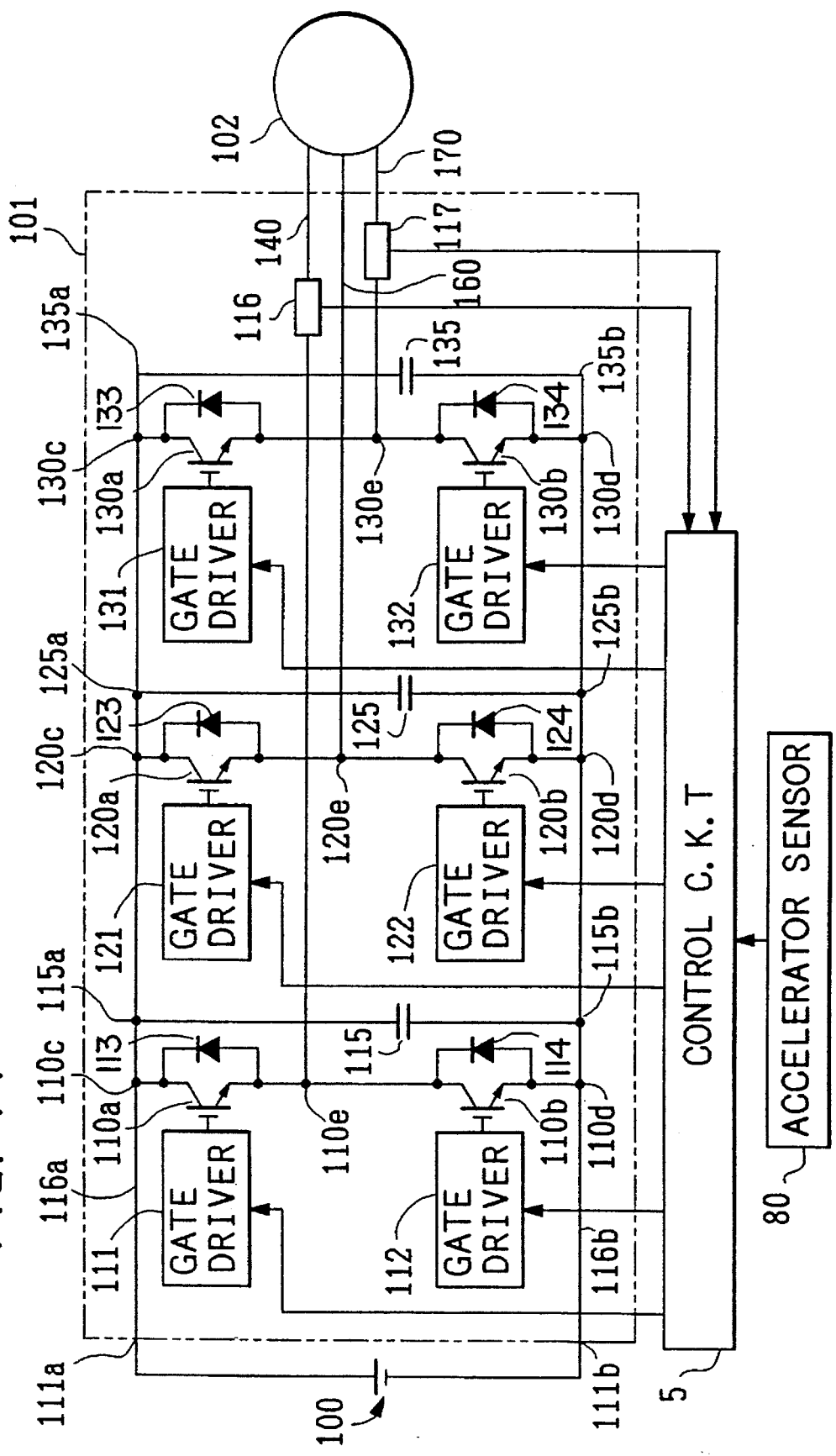
FIG. 11 is a circuit diagram which shows an inverter unit of a third embodiment.

FIG. 10 is a top view illustrating an arrangement of the inverter unit 101 shown in FIG. 8 from which the capacitors 4, the holders 8, the control circuit 5, the snubber circuits 50, and the studs 91 are omitted. The negative bus line 2 is partially bent upward so as to extend over the positive bus line 1 at overlapped portions therewith. In FIG. 10, lines indicative of the bent portions of the negative bus line 2 are omitted for the sake of brevity of illustration.

As appreciated above, the symmetrical arrangement of the two switching units in each pair of switching units 3u, 3v, and 3w provides for a simple geometry of each of the bus lines 1 and 2. Further, the parts arrangement of this embodiment makes it possible to assemble the control circuit 5, the snubber circuits 50, the capacitors 4, the switching units 3u, 3v, and 3w, and the cooling block 7 into a compact unit. Additionally, a heat radiating capacity of the inverter unit 101 is enhanced through the holders 9 and the capacitors 4.

While in the above embodiment, each of the capacitors 4 is oriented horizontally, it may alternatively be so arranged vertically that the charge/discharge terminals 41 and 42 are opposed to the switching units 3u, 3v, and 3w. In this case, it is advisable that the charge/discharge terminals 41 of the capacitors 4 be fastened to the upper surface of the positive bus line 1 and the charge/discharge terminals 42 be also fastened to the upper surface of the negative bus line 2, after which the bus lines 1 and 2 are placed on the positive power terminals 31 and the negative power terminals 32 of the switching units 3u, 3v, and 3w, the positive power terminals 31 are fixed on the positive bus line 1, and then the negative power terminals 32 are fixed on the negative bus line 2. Since the snubber circuits 50 are impossible to mount between the capacitors 4 and the switching units 3u, 3v, and 3w, they need to be arranged at another location.

With the above arrangements, the lengths of the bus lines and 2 between the charge/discharge terminals 41 and 42, and the positive and negative power terminals 31 and 32 become the lengths of the connecting conductors 10 and 20, thus resulting in further decreased inductances of the connecting conductors 10 and 20.

The holders 9 may alternatively be formed with a resin material. This achieves an overall lightweight construction of the inverter unit 101.

Referring to FIGS. 11 to 18, there is shown a third embodiment of the inverter unit 101 whose basic circuit structure is substantially the same as that of the above first embodiment.

The shown inverter unit 101 includes current sensors 116 and 117, IGBTs 110a, 110b, 120a, 120b, 130a, and 130b functioning as switching elements, diodes 113, 114, 123, 124, 133, and 134, smoothing capacitors 115, 125, 135, gate drive circuits 111, 112 121, 122, 131, and 132. The current sensors 116 and 117 measure currents supplied to an induction motor 102, and provide sensor signals indicative thereof to a control circuit 5. The smoothing capacitors 115, 125, 135 are arranged in parallel to the IGBTs 110a, 110b, 120a, 120b, 130a, and 130b, respectively. The gate drive circuits 111, 112, 121, 122, 131, and 132 can be of any known gate driver for driving the IGBTs.

An accelerator sensor 80 is provided which is responsive to movement of an accelerator pedal (not shown) of an electric automobile to provide a sensor signal indicative thereof to the control circuit 5.

In operation, when the accelerator sensor 80 provides a sensor signal representative of movement of the accelerator pedal to the control circuit 5, the control circuit 5 outputs PWM signals to the gate drive circuits 111, 112. 121, 122, 131, and 132 to turn on and off the IGBTs 110a. 110b, 120a, 120b, 130a, and 130b in given cycles for activating the motor 102.

Circuit lines between the DC power source 100 and the inverter unit 101 have an inductance component which prevents the DC power source 100 from providing great current variation components following quick variations in current induced upon on and off operations of the IGBTs 110a, 110b, 120a, 120b, 130a, and 130b. For overcoming this problem, the smoothing capacitors 115, 125, and 135 are provided in the inverter unit 101 of this embodiment which compensate for the quick variations in current of the IGBTs. Thus, it is advisable that the smoothing capacitors 115, 125, and 135 be arranged in the vicinity of the IGBTs 110a, 110b, 120a, 120b, 130a, and 130b, respectively.

Figure 12:
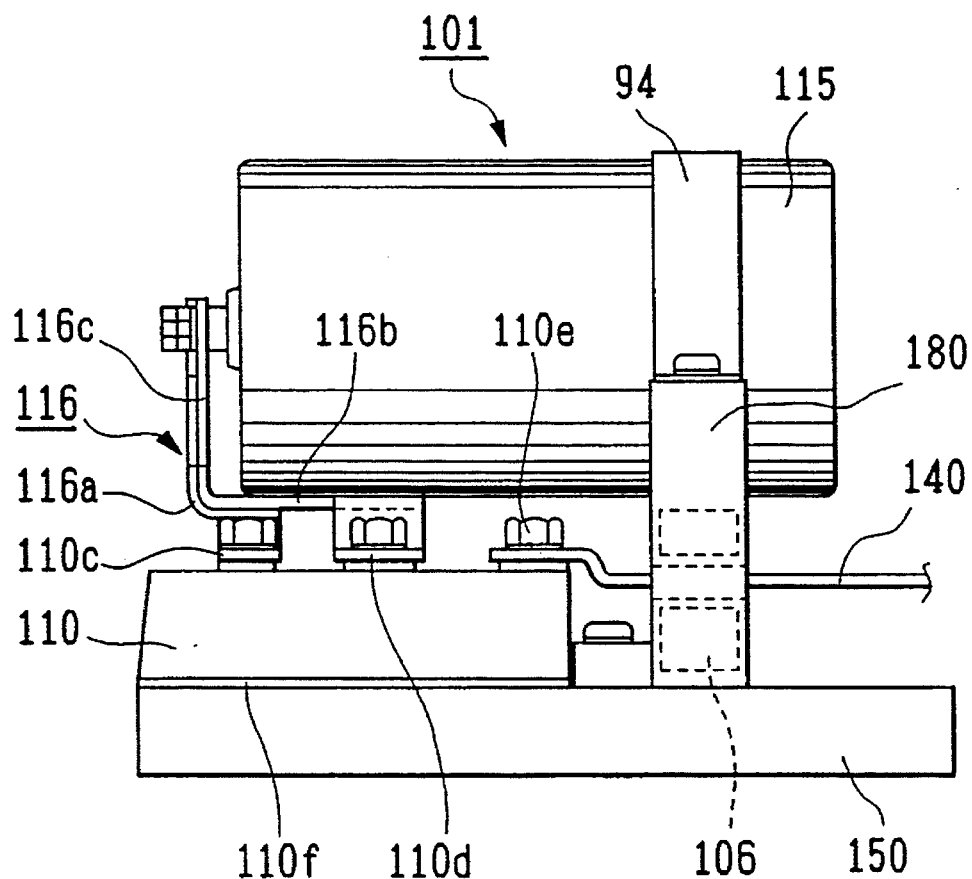
FIG. 12 is a front view which shows an inverter unit of a third embodiment.

FIG. 12 is a front view of the inverter unit 101 which shows only the switching unit 3u for the sake of simplicity of illustration. The mechanical and electrical constructions of the other switching units 3u and 3w are identical with that of the switching unit 3u and explanation thereof in detail will be omitted here.

The switching unit 3u is connected to the capacitor 115 through an L-shaped laminated bus bar 116 made of a strip member. The bus bar 116 is composed of a positive bus bar 116a, a negative bus bar 116b, and an electrically insulating sheet 116c. The positive bar 116a is attached, for example, welded to the negative bus bar 116b through the electrically insulating sheet 116c.

The switching unit 3u has the IGBTs 110a and 110b arranged in series, and is mounted on a cooling metal plate 150. The switching unit 3u also has input/output terminals 110c, 110d, and 110e. The terminal 110c is electrically connected to a positive terminal of the DC power source 100, while the terminal 10c is electrically connected to a negative terminal of the DC power source. The terminal 110e is a junction of the series-connected IGBTs 110a and 110b, and is connected to the motor 102 through a bus bar 140 to serve as an output terminal for power supply to the motor 2.

Figure 14:
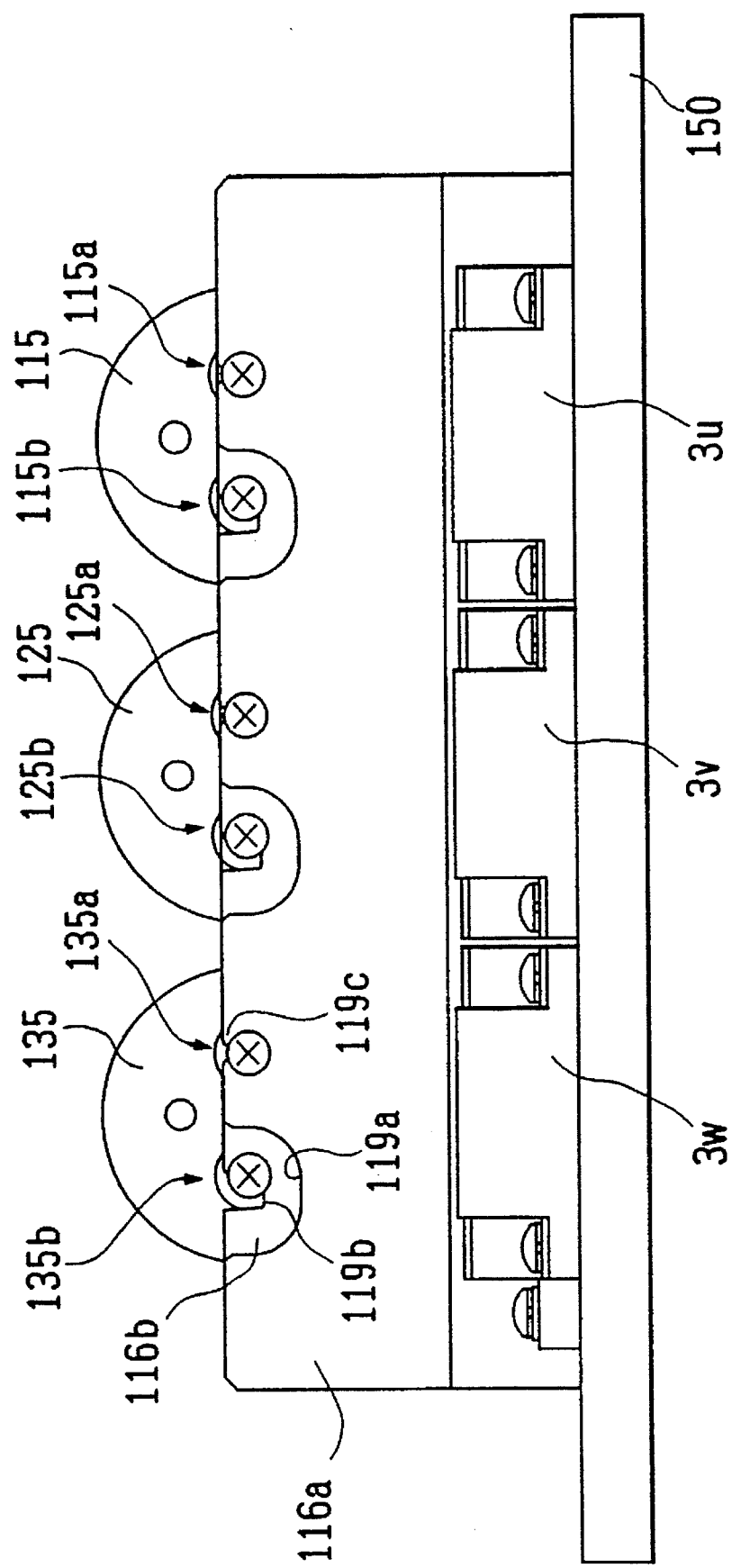
FIG. 14 is a front view which shows switching units of a third embodiment.
Figure 16:
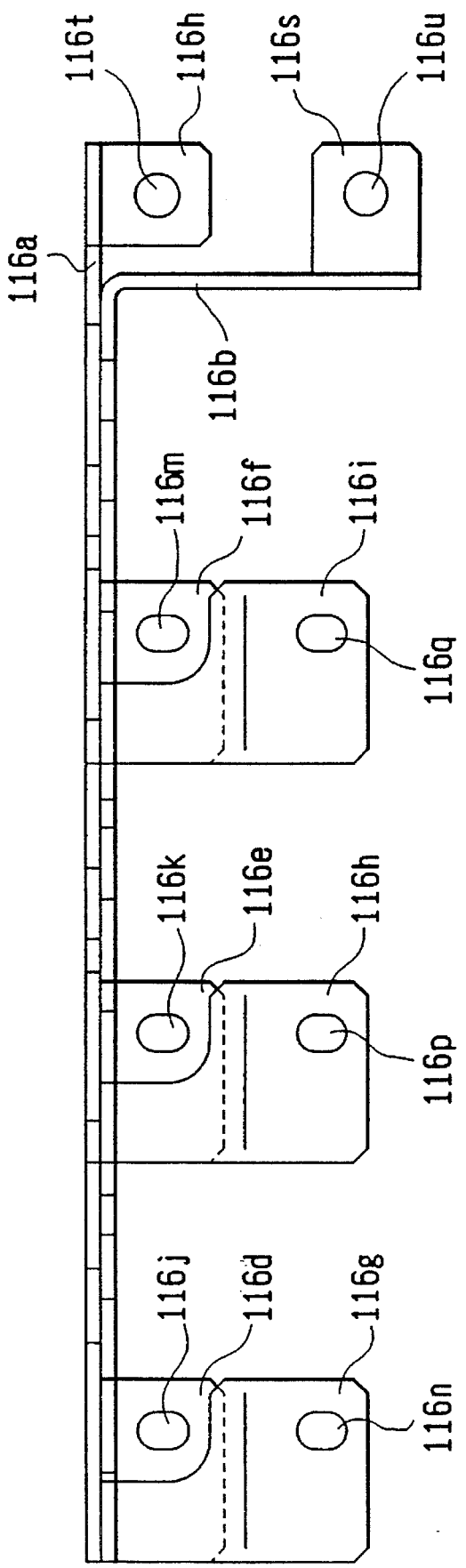
FIG. 16 is a plan view which illustrate bus bars of an inverter unit of a third embodiment.

The positive bus bars 116a and the negative bus bar 116b of the laminated bus bar 116 each have, as shown in FIGS. 12, 14, and 16, a main flat plate. The positive bus bar 116a has, as clearly shown in FIG. 16, three positive terminal plates 116d, 116e, and 116f bent from its bottom at approximately right angles. Similarly, the negative bus bar 116b has three negative terminal plates 116g, 116h, and 116i bent from its bottom perpendicularly.

The positive terminal plates 116d, 116e, and 116f have elongated holes 116j, 116k, and 116m for connecting through screws with positive terminals 110c, 120c, and 130c of the switching units 3u, 3v, and 3w, respectively. Similarly, the negative terminal plates 116g, 116h, and 116i have elongated holes 116n, 116p, and 116q for connecting through screws with negative terminals 110d, 120d, and 130d of the switching units 3u, 3v, and 3w, respectively.

The positive bus bar 116a, as shown in FIG. 16, has also a bent terminal plate 116h extending from its end. The bent terminal plate 116h has a hole 116t for connection through a screw with a bus bar extending from the positive terminal 111a of the DC power source 100. Similarly, an end of the negative bus bar 116b is bent twice to form a terminal plate 116s extending perpendicularly. The bent terminal plate 116s has a hole 116u for connection through a screw with a bus bar extending from the negative terminal 111b of the DC power source 100.

As shown in FIG. 14, the positive bus bar 116a and the negative bus bar 116b have three cut-out portions 119a and 119b formed in alignment with each other at regular intervals. The cut-out portions 119a have a size greater than that of the cut-out portions 119b for ease of tightening screws into the negative terminals 115b, 125b, and 135b of the capacitors 115, 125, and 135 through the negative bus bar 116b.

Additionally, the positive bus bar 116a has also three small cut-out portions 119c in coincident with the positive terminals 115a, 125a, and 135a of the capacitors 115, 125, and 135. The positive bus bar 116a is attached to the positive terminals 115a, 125a, and 135a of the capacitors 115, 125, and 125 using screws.

The use of the laminated bus bar 116 having the structure, as discussed above, allows connection of the switching units 3u, 3v, and 3w with the capacitors 115, 125, and 135 at short distances.

Figure 13:
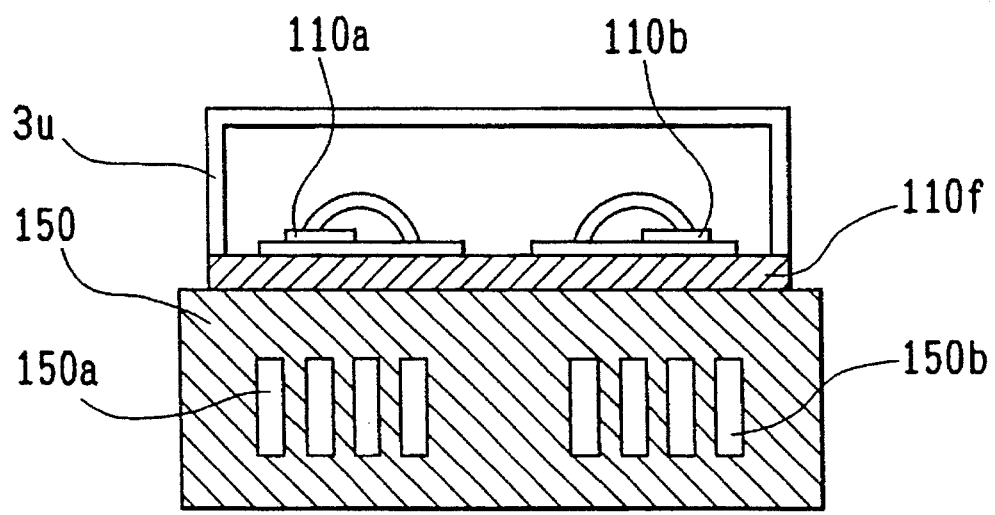
FIG. 13 is a cross sectional view which illustrates one of switching units mounted on a cooling block according to a third embodiment.

FIG. 13 is a cross-sectional view which illustrates the cooling metal plate 150 and the switching units 3u. The IGBTs 110a and 110b are fixed on a metal plate 110f which is attached to an upper surface of the cooling metal plate 150 using screws or adhesive material. The cooling metal plate 150 has cooling paths 150a and 150b through which coolant flows.

Each of the capacitors 115, 125, and 135 is, similar to the first embodiment, supported horizontally on the cooling metal plate 150 through a holder 180 in the same manner as that of the first embodiment. Specifically, an end, or the bottom of each of the capacitors 115, 125, and 135 is inserted into a recessed, or cut-out portion formed in an upper end wall of the holder 180 of resin material, and then clamped through retainers 94 using screws.

Figure 15:
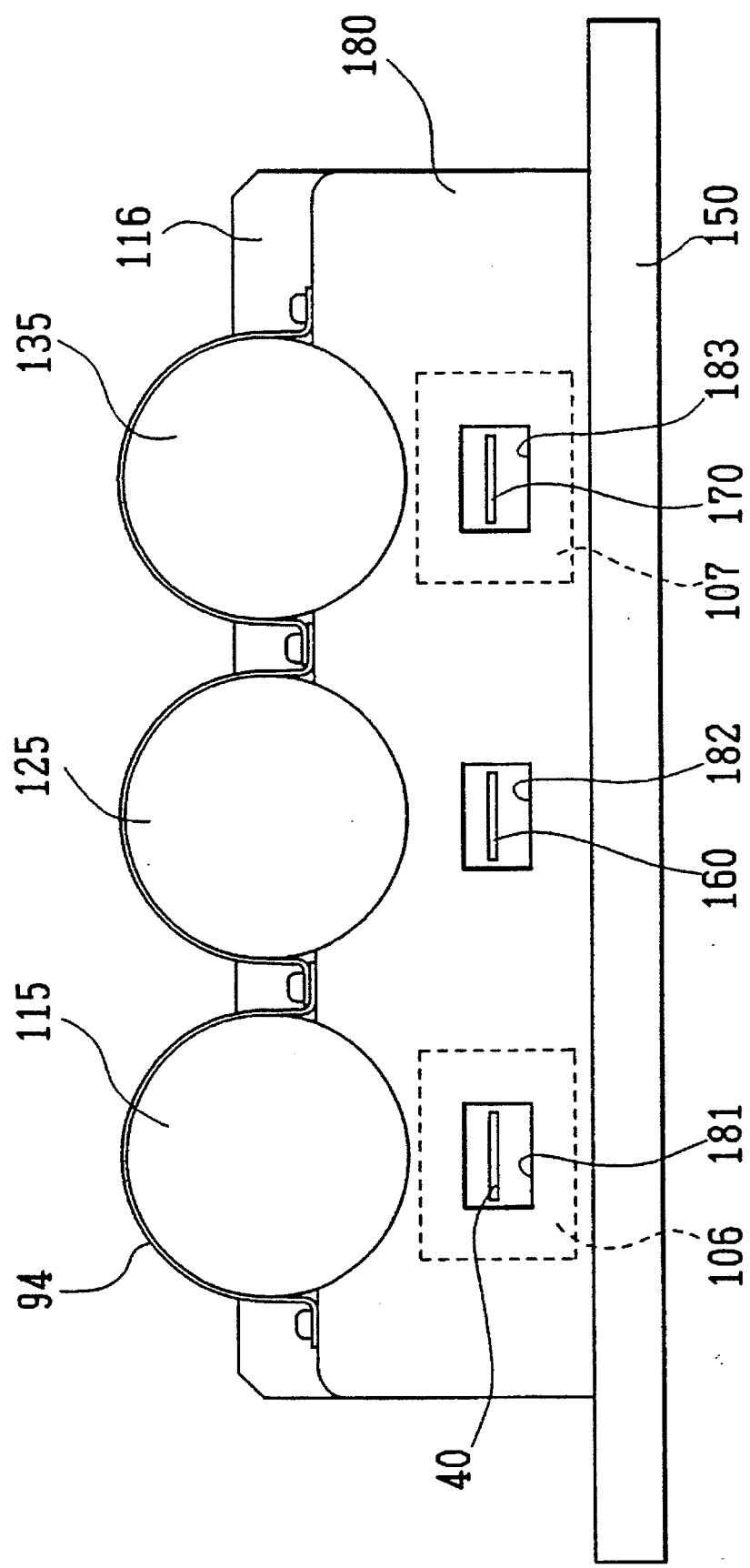
FIG. 15 is a rear view which shows switching units of a third embodiment.

The holder 180, as shown in FIG. 15, has therein non-contact type current sensors 106 and 107 which are arranged on circuit lines between the motor 102 and the switching units 3u and 3w, respectively. The holder 180, as shown in FIG. 15, has formed therein three openings 181, 182, and 183 in the lengthwise direction. Output current bus bars 140, 160, and 170 are inserted through the openings 18 1, 182, and 183, respectively. The output current bus bar 140 supplies the power from the output terminal 110e of the switching unit 3v to the motor 102. The output current bus bar 160 supplies the power from the output terminal 120e of the switching unit 3v to the motor 2. Similarly, the output current bus bar 170 supplies the power from the output terminal 130e of the switching unit 3w to the motor 2.

Figure 17:
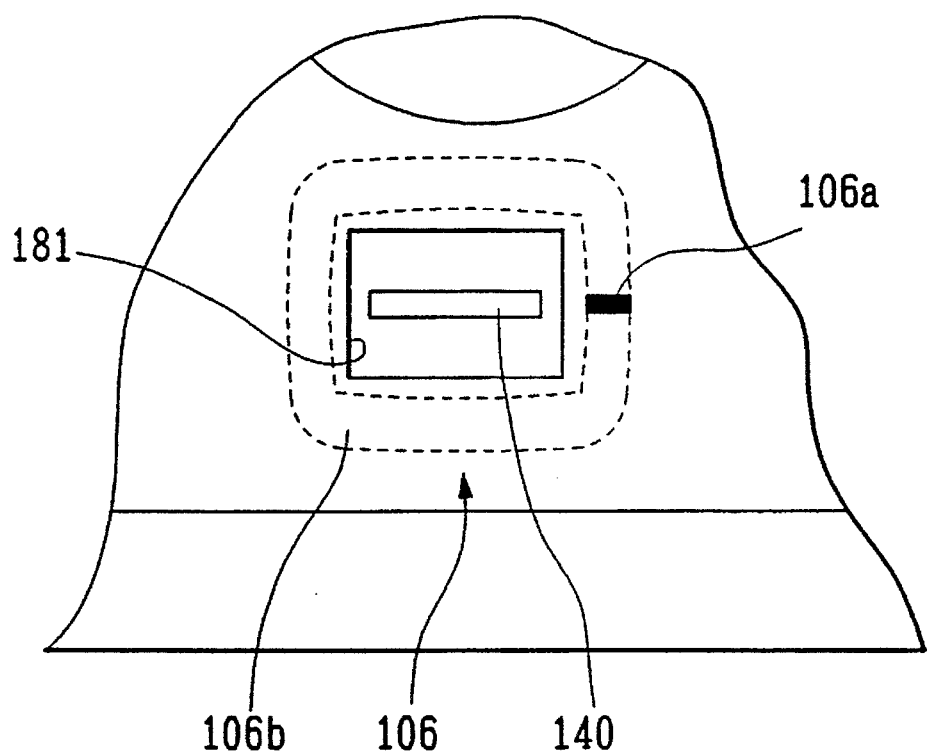
FIG. 17 is an enlarged segmentary view which shows a capacitor holder of an inverter unit of a third embodiment.
Figure 18:
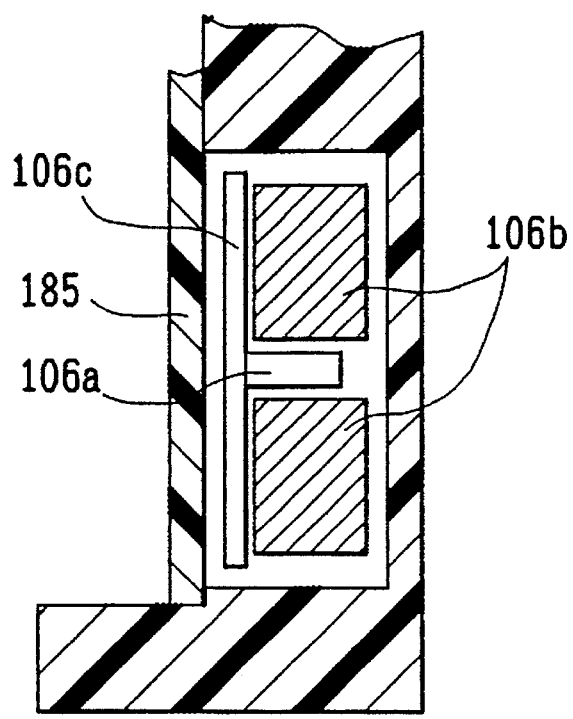
FIG. 18 is a vertical cross sectional view of FIG. 17.
Figure 19:
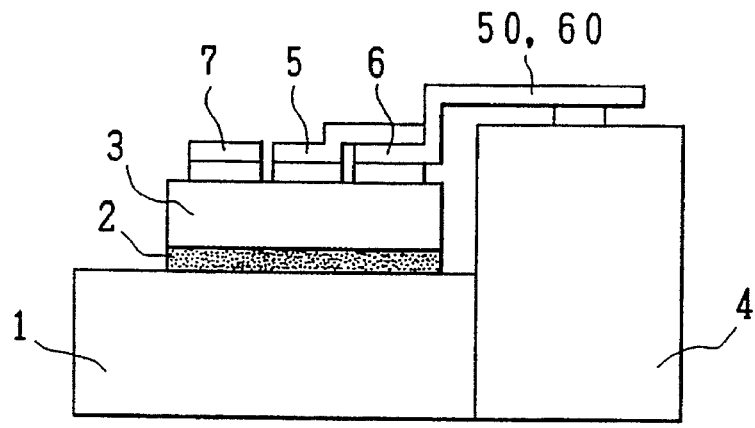
FIG. 19 is a front view which illustrates a conventional inverter unit.
Figure 20:
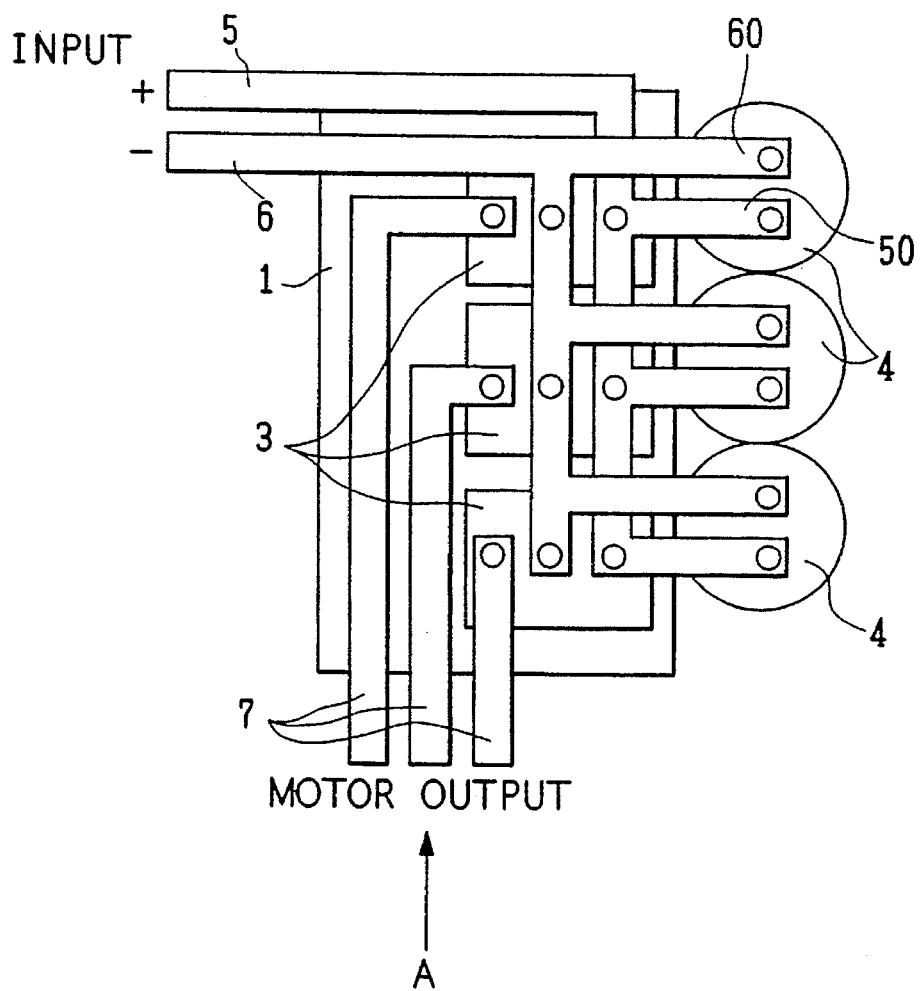
FIG. 20 is a plan view of FIG. 19.

The current sensor 106, as shown in FIGS. 17 and 18, can be of any known current sensor, and includes a hall element 106a, a core 106b, and an amplifier 106c. The core 106b is designed to collect the magnetic flux, produced by the current flowing through the output current bus bar 140 arranged in the opening 181, on the hall element 106a. The amplifier 106c amplifies the output from the hall element 106c. FIG. 18 is a vertical cross-sectional view illustrating a portion around the hall element 6a.

The current sensor 107 has substantially the same construction as that of the current sensor 106. The current sensors 106 and 107 may alternatively be provided with a contact-type sensor.

The holder 180, as shown in FIG. 18, has formed therein sensor storage chambers S (only one is shown) within which the current sensors 106 and 107 are disposed, respectively. The sensor storage chamber S is hermetically closed by a resin cover 185 after the current sensor 106 (107) is mounted. The resin material may be potted in the sensor storage chamber S for sealing the current sensor 106 (107) instead of the resin cover 185.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended clams.

What is claimed is:

1. An inverter apparatus comprising:

a plurality of switching units each switching unit having a box-like casing defined by a bottom wall, side walls, and an upper wall, each switching unit also including a first switching element and a second switching element connected in series between a positive terminal and a negative terminal, the positive and negative terminals being exposed on the upper wall of the casing, the first switching element being connected to a DC power source through a positive bus line extending from the positive terminal, the second switching element being connected to the DC power source through a negative bus line extending from the negative terminal, the first and second switching elements outputting alternating current through an AC current output line;

a cooling support member having a mount surface, on which the bottom wall of each of the switching units is disposed, for cooling the switching units;

a plurality of capacitors, each capacitor in the plurality of capacitors being arranged over the upper wall of the casing of one of the switching units, each of the capacitors having a positive charge/discharge terminal and a negative charge/discharge terminal; and a plurality of pairs of first and second conductive plates, the first conductive plate in each pair of conductive plates connecting the positive terminal on the upper wall of one of the switching units with the positive charge/discharge terminal of a corresponding one of the plurality of capacitors, the second conductive plate in each pair of conduction plates connecting the negative terminal on the upper wall of one of the switching units with the negative charge/discharge terminal of a corresponding one of the plurality of capacitors.

2. An inverter apparatus as set forth in claim 1, wherein each of the first and second conductive plate of each pair of conductive plates is an L-shaped plate, the L-shaped plate having a horizontal portion and a vertical portion, the horizontal portion being secured on the upper wall of the casing of a corresponding one of the switching units and extending horizontally thereover, the vertical portion extending vertically from an end of the horizontal portion to support the corresponding one of the capacitors in the plurality of capacitors.

3. An inverter apparatus as set forth in claim 2, wherein the horizontal portion of one of the first and second conductive plates extends over one of the positive and negative bus lines with an electrically insulating member disposed therebetween.

4. An inverter apparatus as set forth in claim 2, further comprising a capacitor support member disposed on the mount surface of the cooling support member, the capacitor support member extending substantially parallel to a side wall of the casings of the switching units, each of the capacitors in the plurality of capacitors having the positive and negative charge/discharge terminals on a first end portion thereof, the capacitor support member supporting a second end portion of each capacitor in the plurality of capacitors opposite the first end portion.

5. An inverter apparatus as set forth in claim 4, further comprising a control circuit for controlling switching operations of the first and second switching elements of the switching units, the control circuit being supported by the capacitor support member.

6. An inverter apparatus as set forth in claim 1, wherein the switching units are mounted on the cooling support member in first and second rows extending generally parallel to each other, the switching units in the first row being arranged with respect to the switching units in the second row such that the positive and negative charge/discharge terminals thereof mirror the positive and negative charge/discharge terminals of opposing switching units in the second row.

7. An inverter apparatus as set forth in claim 6, wherein the positive and negative bus lines have portions extending between the first and second rows connecting to respective positive and negative charge/discharge terminals of the plurality of capacitors.

8. An inverter apparatus as set forth in claim 6, further comprising first and second holders mounted on the mount surface of the cooling support member, the first holder retaining the capacitors connected to switching units in the first row, the second holder retaining the capacitors connected to switching units in the second row.

9. An inverter apparatus as set forth in claim 8, further comprising a control circuit for controlling switching operations of the first and second switching elements of the switching units, the control circuit being supported by the first and second holders over the cooling support member.

10. An inverter apparatus as set forth in claim 4, wherein the capacitor support member has an opening defined therein in which the AC current output line extends.

11. An inverter apparatus as set forth in claim 10, further comprising a current sensor mounted in the opening defined in the capacitor support member for detecting current flowing through the AC current output line.

12. An inverter apparatus as set forth in claim 2, wherein each of the capacitors in the plurality of capacitors extends in parallel to the mount surface of the cooling support member.

13. An inverter apparatus as set forth in claim 12, wherein each of the capacitors in the plurality of capacitors has a first end on which the positive and negative charge/discharge terminals are provided and a second end opposite the first end along the length thereof, the first end being supported over the cooling support member by the first and second conductive plates, the second end being supported by a holder mounted on the cooling support member.

* * * * *